(12) United States Patent
Chen et al.

(10) Patent No.: US 6,548,224 B1
(45) Date of Patent: Apr. 15, 2003

(54) WIRING SUBSTRATE FEATURES HAVING CONTROLLED SIDEWALL PROFILES

(75) Inventors: Ted T. Chen, Saratoga, CA (US); Michael P. Skinner, San Jose, CA (US)

(73) Assignee: Kulicke & Soffa Holdings, Inc., Willow Grove, PA (US)

( * ) Notice: Subject to any disclaimer, the term of this patent is extended or adjusted under 35 U.S.C. 154(b) by 0 days.

(21) Appl. No.: 09/519,961

(22) Filed: Mar. 7, 2000

(51) Int. Cl.$^7$ ................................................ G03F 9/00
(52) U.S. Cl. ........................ 430/314; 430/311; 430/313; 430/315; 430/322; 430/324; 430/5
(58) Field of Search ................................. 430/311, 313, 430/315, 322, 324, 30, 5

(56) References Cited

U.S. PATENT DOCUMENTS

| | | | | |
|---|---|---|---|---|
| 4,495,220 A | * | 1/1985 | Wolf et al. ................. | 427/82 |
| 4,497,684 A | * | 2/1985 | Sebesta ...................... | 156/643 |
| 4,536,249 A | * | 8/1985 | Rhodes ....................... | 156/643 |
| 4,877,718 A | * | 10/1989 | Moore et al. ............... | 430/326 |
| 4,912,022 A | * | 3/1990 | Urquhart et al. ........... | 430/396 |
| 5,098,815 A | * | 3/1992 | Adamezyk et al. ........ | 430/315 |
| 5,242,770 A | * | 9/1993 | Chen et al. .................. | 430/5 |
| 5,256,505 A | | 10/1993 | Chen et al. .................. | 430/5 |
| 5,328,807 A | * | 7/1994 | Tanaka et al. .............. | 430/311 |
| 5,447,810 A | | 9/1995 | Chen et al. .................. | 430/5 |
| 5,635,010 A | * | 6/1997 | Pepe et al. .................. | 156/264 |
| 5,657,235 A | | 8/1997 | Liebmann et al. ......... | 364/474.24 |
| 5,663,893 A | | 9/1997 | Wampler et al. ........... | 364/491 |
| 5,667,940 A | * | 9/1997 | Hsue et al. .................. | 430/312 |
| 5,707,765 A | | 1/1998 | Chen ............................ | 430/5 |
| 5,723,233 A | | 3/1998 | Garza et al. ................. | 430/5 |
| 5,776,662 A | * | 7/1998 | Shirai et al. ................ | 430/313 |
| 5,786,270 A | * | 7/1998 | Gorrell et al. .............. | 438/613 |
| 6,258,489 B1 | * | 7/2001 | Stanton et al. .............. | 430/5 |
| 2001/0021490 A1 | * | 9/2001 | Lee et al. ..................... | 430/396 |

OTHER PUBLICATIONS

J. Fung Chen et al., "Practical Optical Proximity Correction for Full–Chip Implementation," *SPIE Article* (Feb. 1997).

Burn J. Lin, "Phase–Shifting and Other Challenges in Optical Mask Technology," *IBM General Technology Division*, pp. 1–26 (Sep. 1990).

* cited by examiner

*Primary Examiner*—Janet Baxter
*Assistant Examiner*—Yvette C. Thornton
(74) *Attorney, Agent, or Firm*—Townsend and Townsend and Crew LLP

(57) ABSTRACT

A dielectric layer in a wiring substrate having a sloped sidewall. A photomask used to pattern the dielectric layer includes optical proximity features. The size and spacing of the optical proximity features are generally less than the resolution limit of the exposure tool used and do not print out on the layer. The optical proximity features provide a transition region between fully exposed material and un-exposed material, which results in a sloped sidewall of the photo-sensitive material after development. The sloped sidewall provides a more reliable thin film metal layer to contact through vias, and may be used to conserve wiring board area by allowing smaller via spacing.

30 Claims, 6 Drawing Sheets

WIRING SUBSTRATE FEATURES HAVING CONTROLLED SIDEWALL PROFILES

BACKGROUND OF THE INVENTION

The present invention relates to the use of thin-film deposition technology to create high density interconnects on a laminated printed wiring board substrate. More specifically, the present invention pertains to a method for controlling the wall profile of vias and other features in the deposited thin-film layers to improve electrical and/or mechanical performance. The method of the present invention is useful for high density integrated circuit packaging of single chip, multi-chip, and support components such as resistors and capacitors. The method of the present invention is also useful for creating interconnections on high density daughter boards that carry packaged devices as well as in the semiconductor devices themselves.

The semiconductor industry continues to produce integrated circuits of increasing complexity and increasing density. The increased complexity of some of these integrated circuits has in turn resulted in an increased number of input/output pads on the circuit chips. At the same time, the increased density of the chips has driven the input/output pad pitch downward. The combination of these two trends has been a significant increase in the connector pin wiring density needed to connect the chips to packages that interface with the outside world and interconnect the chips to other integrated circuit devices.

A number of different technologies have been developed to interconnect multiple integrated circuits and related components. One such technology, based on traditional printed wiring board ("PWB") technology that found wide use during the period in which integrated circuits were packaged in surface mount devices like quad flat packs (QFPs), is often referred to as multi-chip module laminate ("MCM-L") technology. MCM-L technology typically uses layers of copper foil and insulating dielectric material, typically as a sub-laminate sheet of a dielectric layer sandwiched between sheets of copper foil, as building blocks to create the required interconnect structures. The process of forming a conductive pattern on the sub-laminate in MCM-L technology typically includes forming a film of photo resist over a copper layer, patterning and developing the photo resist to form an appropriate mask, and selectively etching away the unwanted copper to leave a conductive pattern.

Interconnection between stacked layers can be provided by a plated through hole ("PTH") formed by drilling a hole through the laminated stack and plating the inside surface of the hole. The drilling process is relatively slow and expensive and uses a relatively large amount of board space. As the number of interconnect pads increase, the amount of board area consumed by PTHs increases, reducing the area available for signal line routing. Additionally layers can be added to the laminate to accommodate additional wiring lines, but this typically increases the cost and decreases the electrical performance.

Substrates used in MCM-L technology can be efficiently manufactured in large area panels that lower the cost of production. Interconnect solutions using this technology generally have relatively good performance characteristics for components with sufficiently large pad spacing and low pad density because of conductivity of the relatively thick copper and low dielectric constant (e.g. less than or equal to 4.0) of the dielectric material. The printed wiring board industry; however has tried to keep pace with the advances in semiconductor manufacturing in terms of pad spacing and density. As a result, alternative technologies have been developed.

One approach to accommodate high-density pad components on an MCM substrate is to use thick film (screen printing) conductor traces on ceramic substrates ("MCM-C"). Basically, MCM-C technology involves rolling a ceramic mix into, sheets, drying the sheets, punching vias, screening the rolled sheets with a metal paste to fill the vias and define the trace pattern on the surface of the ceramic, stacking and laminating all the layers together, then co-firing at a high temperature (e.g. greater than 850° C.) to achieve the desired interconnections.

MCM-C construction has found extensive use in high density and high reliability products where the robustness of the high density interconnect package outweighs the cost considerations. The ability to create a hermetic seal,in the ceramic improves the ability to withstand environments not tolerable to conventional printed wiring board technology. While this technology is capable of high density packaging applications (e.g. greater than 1000 pads), it is also very costly. Additionally, performance characteristics, such as signal propagation time, are affected due to the relatively high dielectric constant (e.g. between 5.0 and 9.0) of the ceramic material.

To improve the interconnect density of MCM-L technology, an approach called build-up multi-layer has been developed. In this technology, a build-up layer is formed on one or both surfaces of a laminated wiring board core with patterned conductive layers and PTHs. There are many variations to this approach, but typically a dielectric layer approximately 50 microns thick is formed on both the top and bottom major surfaces of the conventionally fabricated printed wiring board substrate. Vias are made-in the conventional build-up layer by laser ablation, photo mask/plasma etch, or other known methods. An electroless seeding step is then done prior to a panel plating step that metalizes both the upper and lower surfaces. Subsequent masking and wet etching steps then define a desired conductive pattern over the build-up dielectric layers.

A third approach to forming high density wiring substrates uses thin-film type deposition and patterning technology. This technology is sometimes referred to as "MCM-D" or deposition on laminate ("DONL"). This technology has been adapted to substrates of 40 centimeters by 40 centimeters or more, thereby providing efficiencies that lower the costs of production. MCM-D technology can be used on low cost printed wiring board structures, with or without a build-up layer on the printed wiring board. This combination of existing conventional high volume printed wiring board technology and advanced thin-film deposition technology represents a significant economic advantage and density improvement as compared to the previously discussed MCM-L and MCM-C technologies.

However, despite the definite advantages of MCM-D technology, there are potential problems that may result in failure modes and performance limitations if the deposited thin-film layers- are not properly implemented. One key to proper implementation of the deposited thin-film layers is reliably making the conductive vias between layers of patterned conductive traces. In MCM-L technology, the drilled holes are relatively large, and the plating solution reliably plates the inside diameter. In MCM-C technology, the thick-film paste is also somewhat liquid, and reliably fills the via holes to form a conductive via. However, in MCM-D technology, a combination of thin metal layers, relatively thick dielectric layers, small via geometry can reduce the reliability of conductive vias, or result in open vias and a rejected substrate.

One approach to improve conductive vias in MCM-D substrates is to re-flow or otherwise thermally alter the dielectric layer after forming the via holes. The via holes are typically formed in a layer of photo-sensitive polymer material that will become the dielectric layer underlying the thin-film metal layer. The dielectric precursor material is typically applied as a liquid, by spraying, spinning, dipping, etc., and pre-baked to convert the material to an essentially solid photosensitive layer. This pie-baked layer is then exposed to light through a patterned photo mask and developed. Development typically consists of washing the exposed.layer with a solvent or other liquid to remove part of the layer. The material exposed to the light might remain or might be washed away, relative to the un-exposed material, depending on whether the dielectric material is photo. positive or negative, similar to photo-resist materials.

After development, the dielectric material is typically hard-baked to produce the patterned dielectric layer. This pattern typically includes via holes. The sidewall profile of the hole can affect the subsequent reliability of the metal layer formed over the surface of the via. For example, if the bottom of the hole is larger than the opening, or even if the via hole walls are vertical, the opening can "shadow" portions of the via during a metal sputtering process, for example. This can form thin regions in the metal layer, affecting reliability.

One approach to avoiding this problem is to form sloped via walls by thermally treating the dielectric layer after development to re-flow the material. Other methods include the use of low photo-contrast dielectrics to achieve a less precise transition between developed and un-developed material, or using a photo resist/reflow/dry transfer method. These methods can form a via hole with a sloped wall; however, they are omni-directional, consume additional surface area otherwise desirable for signal line routing, and wall contour control remains difficult due to lack of accurate process control.

Accordingly; improved methods are desirable to control the side wall profile of the via walls in MCM-D technology.

SUMMARY OF THE INVENTION

The present invention provides a method of forming vias with sloped walls and improved metal layer formation in thin-film layers of high density interconnect substrates. Optical proximity effects are used to expose an edge region of a via or other feature in a photosensitive dielectric layer. In a further embodiment, an elongated via hole is formed, with sloped walls at each end of the long axis, thus conserving board area.

According to a method of the present invention, a mask used to define via locations is constructed in such a way that the.energy impinging on the dielectric defines both the shape of the via and the angle of the via walls in the thin-film dielectric layer. By controlling the shape of the via it is possible to achieve maximum interconnect wiring density and by controlling the angle of the via walls, it is possible to achieve reliable electrical contacts between metal layers.

In another embodiment, improved adhesion of dielectric layers overlying a patterned metal layer is achieved. A photoresist layer is formed with a trench having a sloped wall(s). A metal layer is formed to fill the trench and the photoresist removed to leave a metal trace. A subsequent dielectric layer formed by flowing liquid dielectric precursor over the patterned metal layer is mechanically secured to the substrate by the overhanging wall of the metal trace, as well as the bonding of the dielectric material to the underlying material. This and other embodiments of the present invention, as well as its advantages and features, are discussed in more detail in conjunction with the text below and attached figures.

DESCRIPTION OF THE SPECIFIC EMBODIMENTS

The present invention provides a printed wiring substrate with improved electrical contact and reliability in vias in a thin-film stack, and a method for making such substrates. In one embodiment, the beneficial characteristics are obtained by using optical proximity effects to produce an exposure gradient in a photosensitive polymer dielectric layer. In a further embodiment, the optical proximity effects are applied to a selected portion of the perimeter of the via to obtain an oblong or other shaped via opening, thus saving board area. In another embodiment, optical proximity effects are used to form metal traces with re-entrant sidewalls, which mechanically bond a subsequent dielectric layer to the substrate.

In order to properly provide details of the present invention, it is desirable to understand the printed wiring substrate upon which it is implemented. The printed wiring substrate serves two main functions. First, it is the platform upon which a high-density thin-film interconnection (thin-film "stack") is built. Second, it can provide a transition between the very small pitch (e.g. 50–250 microns) of the solder bump, ball grid, or flip chip devices mounted on the substrate and the relatively coarse pitch (e.g. 0.8–1.27 mm) of the electrical contacts needed to mate to the outside world, such as through an edge connector or cable connector.

Figure 1A:
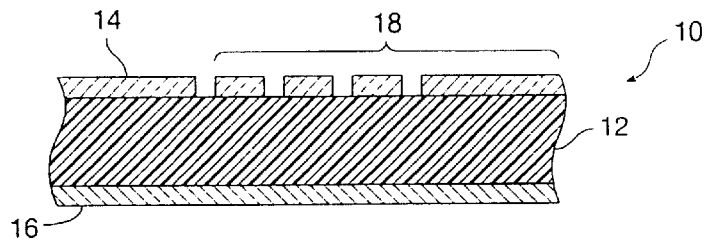
FIG. 1A is a simplified cross section of a laminated board as is used to form a multi-layer laminated wiring substrate.

FIG. 1A is a simplified cross-sectional view of a single laminate printed wiring board substrate 10 that can be used as a sub-laminate sheet in a multi-layer laminated substrate. The substrate is formed from a layer of insulating material 12 such as Mitsubishi BT HL810™ resin or "NEMA FR5" epoxy resin with half-ounce (i.e., about 17 micron) copper foil sheets 14 and 16 laminated to its upper and lower surfaces, respectively. "Upper and lower" are used herein simply as relative terms for ease of description, and do not limit the actual orientation of any layer or structure. A desired conductor pattern 18 is transferred to the copper using photolithography and a wet chemical etch to remove the unwanted copper, leaving the desired circuit pattern. Several of these sub-laminates with various circuit patterns can be laminated together to form a multi-layer printed wiring substrate as shown in FIG. 1B.

Figure 1B:
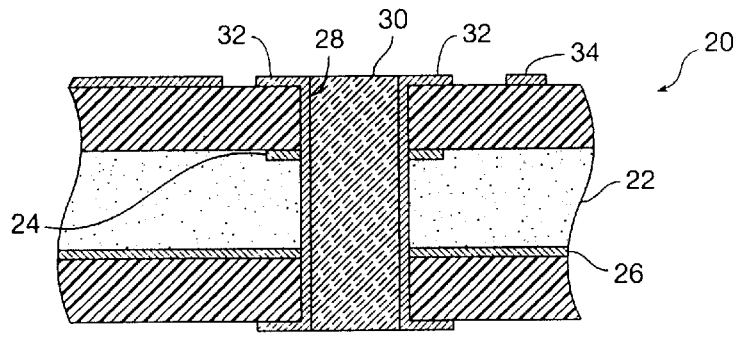
FIG. 1B is a simplified cross section of a multi-layer laminated wiring substrate.

FIG. 1B is a simplified cross-sectional view of a four-layer printed wiring board substrate 20 which can make use of the present invention. The substrate includes two sub-laminate structures similar to that shown in FIG. 1A. "Four-layer" refers to the four metal layers- two on each sub-laminate sheet. An additional insulative epoxy layer 22 separates and joins the sub-laminate sheets. Internal conductive layers 24, 26 are typically used for power and ground planes, and to provide stiffness to the printed wiring board substrate, although signal lines may be incorporated into these layers. A plated through hole ("PTH") 28 forms an electrical connection between one conductive layer and another. These PTHs are filled with a plug material 30, for example, a conductive epoxy. The plug material provides a planar surface with the collar or flange of the PTH to form a pad 32. Alternatively, the PTH can be capped (not shown), with or without filling. A surface metal feature 34 is typically about 17–35 microns thick.

Figure 1C:
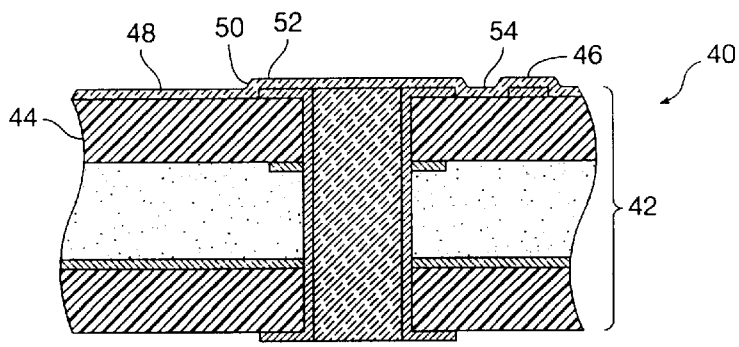
FIG. 1C is a simplified cross section of a multi-layer laminated wiring substrate with a build-up layer on a surface of the substrate.

FIG. 1C is a simplified cross section of a portion of a printed wiring substrate 40 with a laminated substrate base 42. The laminated substrate base includes a dielectric layer 44, similar to layer 12 discussed above in relation to FIG. 1A, as well as a patterned metal layer 46. A conventional build-up layer 48, about 50 microns thick, has been applied to the laminated substrate.

Figure 1D:
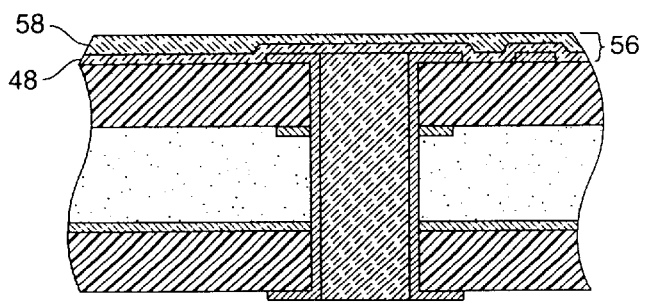
FIG. 1D is a simplified cross section of a multi-layer laminated wiring substrate with a planarized dielectric layer.

FIG. 1D is a simplified cross section of a portion of a printed wiring substrate with a planarized dielectric film 56. Film 56 includes a layer of dielectric material 58 formed over a layer of dielectric material 48. The resulting two-layer film 56 provides an improved surface for the application of thin-film techniques to the wiring substrate. The planarizing layer 58 can be applied as a liquid, by spinning, spraying, or curtain dipping, for example. In a preferred embodiment, the planarizing dielectric material is spun-on, and in some instances may be applied as several layers. Suitable materials include V-259PA™, dielectric material, available from NIPPON STEEL of Tokyo, Japan and AVATREL™, dielectric material, available from the BF GOODRICH COMPANY, for example. In another embodiment, a build-up layer may be provided on a surface of the laminated wiring substrate. In general, it is desirable that the planarized dielectric layer has a surface step topology of about 2 microns or less.

Figure 2:
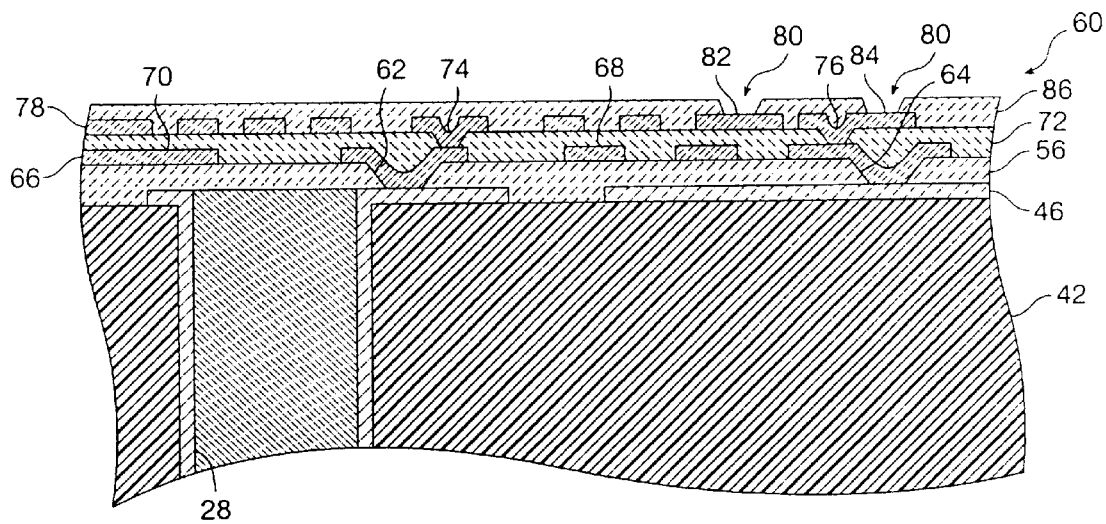
FIG. 2 is a simplified cross section of a printed wiring board substrate with a thin-film stack and structures according to an embodiment of the present invention.

FIG. 2 is a simplified cross section of a portion of a printed wiring substrate 60 with a thin-film stack and vias according to an embodiment of the present invention. A laminated substrate 42 with a metal layer 46 and PTH 28 is covered with a dielectric layer 56. Vias 62, 64 have been formed in the dielectric layer and a patterned thin-film metal layer 66 has been formed to make electrical contact to the metal layer 46 underlying the vias, and to form other features, such as signal lines 68 or ground planes 70. The thin-film metal layer is a copper layer pattern plated on a sputtered chrome-copper seed layer, for example, and is between about 2–10 microns, typically less than 5 microns, thick. A thin-film dielectric layer 72 has been formed over the patterned thin-film metal layer 66. This dielectric layer is spun-on V-259PA™, dielectric material, for example, and is about 10 microns thick (measured over the thin-film metal layer), but could be other material and/or another thickness. Vias 74, 76 have been formed in the thin-film dielectric layer to expose the underlying thin-film metal layer. The vias have a sloped sidewall profile, which is discussed in further detail below.

A second patterned thin-film metal layer 78 has been formed over the thin-film dielectric layer 72 and patterned. This second thin-film metal layer includes contacts 80 through the vias in the thin-film dielectric layer that electrically couple to the underlying thin-film metal layer, as well as other structures, such as signal lines 82 and contact pads 84. A second thin-film dielectric layer 86 has been formed over the second thin-film metal layer. This layer may not be necessary in some applications, and serves to passivate (protect) the underlying metal layer, and as a solder mask. Contact vias 80 allow electrical connection to the printed wiring substrate, such as by wire bonding or solder ball grid array techniques.

Figure 3A:
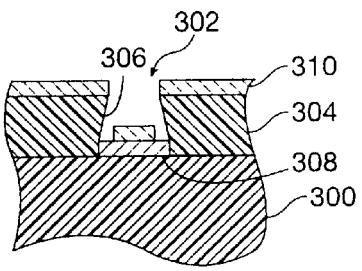
FIGS. 3A–3C show various via wall profiles.
Figure 3B:
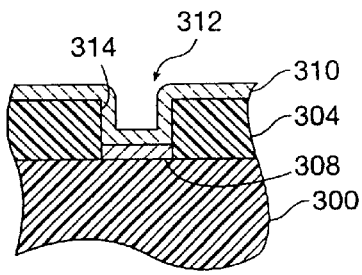
Figure 3C:
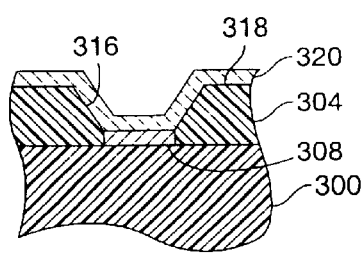

FIGS. 3A–3C illustrate how via sidewall profile can affect the electrical contact to the underlying metal pattern. Dimensions and thicknesses are exaggerated for purposes of illustration. FIG. 3A is a simplified cross section of a portion of a substrate 300 with a via 302 formed in a dielectric layer 304. The via sidewall 306 is re-entrant or undercut, that is, the via opening is more narrow than the via floor. This condition can occur, for example, through a combination of improper exposure to light and incorrect cure step parameters. The via floor exposes an underlying metal feature 308. A thin-film metal layer 310 has been formed over the dielectric layer 304 and on the metal feature 308; however, the sidewall profile of the via interrupts the thin-film metal layer, resulting in an open circuit between the metal feature and the thin-film metal layer lying on the dielectric layer.

FIG. 3B shows a via 312 with vertical sidewalls 314. A thin-film metal layer 310 has been formed on the dielectric layer 304, sidewalls 314 and underlying metal feature 308. It is understood that the thickness of the metal on the sidewalls depends on several factors, such as aspect ratio of the via and the technology used to form the metal layer. For example, a relatively deep, narrow via may prevent a sidewall metal layer of uniform thickness using a sputtering process because the deeper portion of the via will be shadowed by the opening, or reverse sputtering may occur at the corners. However, even if other metal film techniques are used, such as pattern plating, vias with vertical sidewalls present problems. For example, the relatively sharp corner acts as a stress riser that can initiate a crack in the metal when the assembly is subjected to changes in temperature because the metal typically has a different coefficient of thermal expansion than the dielectric material. Thus, a vertical sidewall and sharp corner can also result in a failure of the electrical path.

In FIG. 3C the via sidewall 316 angle has been formed according to an embodiment of the present invention. A positive, or opening, sidewall angle allows for complete metalization of the via sidewalls and floor, and eliminates the sharp corner associated with a perpendicular sidewall. In this figure the thin-film metalization layer 320 has been deposited to a uniform thickness, unlike the metal layer 310 in FIGS. 3A and 3B. It is desirable that the wall angle be about 50–80 degrees from the horizontal plane defined by the via floor (major surface of the substrate). Of course, a larger opening uses more area of the field 318 of the dielectric layer 304, thus reducing the area available for routing signal lines. In a preferred embodiment, the via sidewall angle is between about 60–75 degrees, preferably about 72 degrees. A wall angle of 72 degrees adequately reduces stress at the corner of the via opening while limiting area consumed by the outer wall diameter.

Figure 4A:
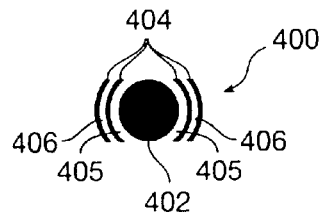
FIG. 4A shows a simplified representation of a photo mask pattern for forming a via hole according to an embodiment of the present invention.

FIG. 4A shows a top-view simplified representation of a photomask pattern 400 for forming a via hole with sloped sidewalls according to an embodiment of the present invention. A conventional mask pattern has a central mask element 402; however, photomask pattern 400 also has peripheral mask elements 404 spaced apart from element 402 by gaps 405 and 406. The size and spacing of the peripheral mask elements are both generally equal to or smaller than the resolution limit of the exposure tool for a given photo masking process. For example, an exposure tool with a nominal 10 micron resolution limit for line spacing would suggest peripheral mask element dimensions and spacings between about 6–7 microns, in other words, less than about 80% of the specified resolution limit. It is noted that the specified resolution limit applies to closely spaced features, and is generally greater than the resolution limit for a stand-alone feature, which might be 8 microns in the preceding example. The size and spacing of the peripheral mask elements are chosen to provide a desired sidewall slope to the photosensitive material without "printing out" the peripheral mask element pattern. Thus, the size and spacing of the peripheral mask elements defines them as optical proximity features. Those skilled in the art will appreciate that the specific numbers given above are given as an example only, and that the selection, treatment, exposure conditions, and development of the photosensitive layer may affect the resolution limit achieved with a particular exposure tool.

The combination of the central mask element and peripheral mask elements create optical proximity effects when exposing the photo-sensitive dielectric layer to light from an exposure lamp shone through the photomask that includes photomask pattern 400. These optical proximity effects are similar to optical proximity correction ("OPC") techniques used in integrated circuit manufacturing when exposing features with very small, typically sub-micron, critical dimensions ("CDs"). However, while OPC is used for enhancing pattern definition, the current method uses similar techniques to adjust the slope of a sidewall of a via. Such a via might be 50 microns or more in diameter; however, the technique is applicable to other sizes, materials, and thicknesses, specifically dimensions less than 50 microns. It should be recognized that OPC is typically used with very thin (0.8–1.2 micron) layers of photoresist that is typically stripped after it has served as a mask, while the current technique is adapted to much thicker, typically about 10 micron thick, layers of photo-sensitive polymer dielectric precursor material that can be incorporated into the thin-film stack.

Figure 4B:
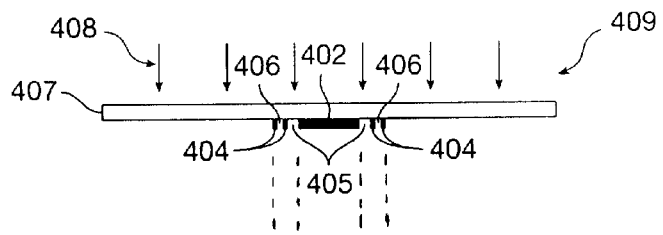
FIGS. 4B is a pattern of FIG. 4.
Figure 4C:
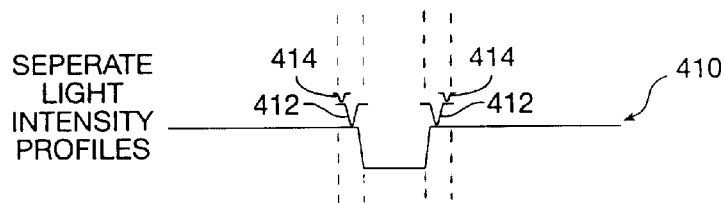
FIGS. 4C–4E are light intensity profiles illustrating an optical proximity effect for forming a sloped via wall according to the present invention.
Figure 4D:
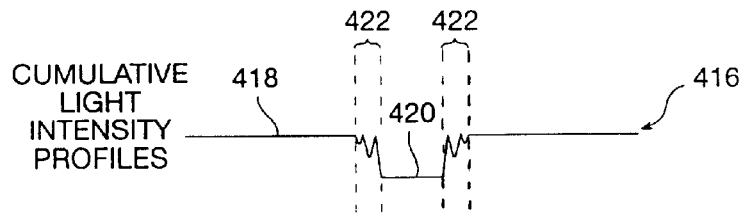
Figure 4E:
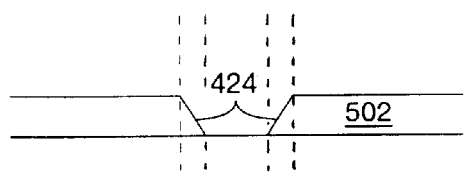

FIG. 4B is a simplified side view of a photomask 409 with the central mask element 402 and peripheral mask elements 404, typically chromium patterned on a glass blank or substrate 407. Light, represented by arrows 408, is shone through the photomask, and is blocked by the mask elements 402, 404. The dimensions and spacing of the mask elements creates gaps 405 and 406 and is chosen to achieve the desired optical proximity effect, as illustrated in FIGS. 4C–4E. As discussed above in conjunction with FIG. 4A, the size and spacing of the mask elements may be chosen for a particular system of material, exposure, and development, in addition to the resolution limit of the exposure tool.

FIG. 4C is a simplified illustration of the resultant light intensity profile of the light shone through the mask 406. To understand the method of the present invention it is necessary to understand the cumulative effects of the energy profiles 410, 412, and 414 created by the photomask pattern elements. The intensity profile varies from essentially zero beneath the central element to essentially 100% under the clear field of the photomask. Note that this energy transfer occurs in all mask tools including contact lithographers, projection lithographers, and proximity lithography tools. The relative position and magnitude of the three light intensity profiles are shown as separate stacked profiles 410, 412, and 414 for ease of illustration where profile 410 represents the profile created by mask element 402, profile 412 represents the profile created by inner element 404 and profile 414 represents the profile created by outer element 404. In practice, however, these profiles overlap and exist as a sum of intensities 416, as shown in FIG. 4D. While a conventional mask forms a sharp transition between fully exposed region 418 and fully shadowed region 420, the present invention includes a transition region 422, as shown in FIG. 4D, formed by optical proximity effects. In this transition region, the photosensitive dielectric precursor does not fully convert; however, it partially converts, thus some of the material remains during the development process. The amount of material remaining is roughly proportional to the degree of exposure, for the negative photosensitive material shown in this example. It is understood that a positive photosensitive material could be used, with appropriate adaptation of the photomask and related details. The partially developed material forms a sloped wall in the dielectric material 502, represented by the line 424 in FIG. 4E. It is understood that the peripheral mask elements could circle the central mask element; however, having the peripheral mask elements on opposite ends of the central mask element has further advantages.

Figure 5A:
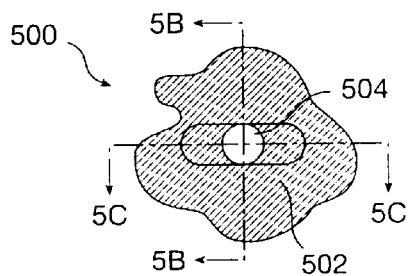
FIG. 5A is a simplified top view of a via formed according to the photo mask pattern of FIG. 4A.

FIG. 5A is a simplified top view of a via hole 500 formed by a mask as shown in FIG. 4B. The via hole is oblong, with a long axis and a short axis. The long axis results from the optical proximity effects of the peripheral mask elements on the opposite ends of the central mask element. In an alternative embodiment, only one set of peripheral mask elements is provided to create a via hole that is elongated to only one side. Electrical contact can be made through the dielectric layer 502 to an underlying metal layer 504.

Figure 5B:
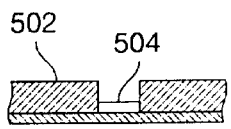
FIG. 5B is a simplified cross section taken from a section line shown in FIG. 5A.
Figure 5C:
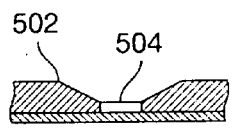
FIG. 5C is a simplified cross section taken from a second section line shown in FIG. 5A.

FIG. 5B is a simplified cross section taken along the short axis section shown in FIG. 5A, and FIG. 5C is a simplified cross section taken along the long axis section shown in FIG. 5A. The oblong via opening according to this embodiment provides a sloped sidewall to insure a low-stress contiguous metal film between the field of the dielectric and the underlying metal layer while reducing the surface area that would be consumed if the via bole was round, thus conserving more surface area for routing signal lines or providing a reference plane.

FIGS. 6A–6E are simplified cross sections showing the fabrication of a printed wiring substrate according to another embodiment of the present invention. Optical proximity effects are used to form a trench with sloped walls in a sacrificial layer. The trench is then filled with metal to form a metal trace with a wedge-shaped cross section and the sacrificial material is removed. Subsequently, a liquid dielectric precursor is applied over the metal trace and is developed into a dielectric layer. The wedge shape of the metal trace mechanically anchors the dielectric layer to the substrate, in addition to any other bonding that may occur between the dielectric layer and the substrate. The metal layer often has higher bonding (peel) strength than the dielectric layer, hence providing the wedge-shaped cross section improves resistance to delamination of the wiring substrate.

Figure 6A:
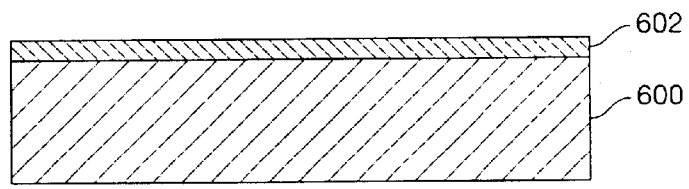
FIGS. 6A–6E are simplified cross sections of a portion of a substrate illustrating the formation of a conductive trace according to another embodiment of the present invention.

FIG. 6A is a simplified cross section showing a photo sensitive layer 602 on a printed wiring substrate 600. The photosensitive layer could be photoresist or photosensitive dielectric precursor, such as V-259PA™, dielectric material, for example. It is desirable that the thickness of the photosensitive layer be at least as thick as the subsequent metal layer will be, generally about 2–10 microns, typically about 3–5 microns, but this is not necessary.

Figure 6B:
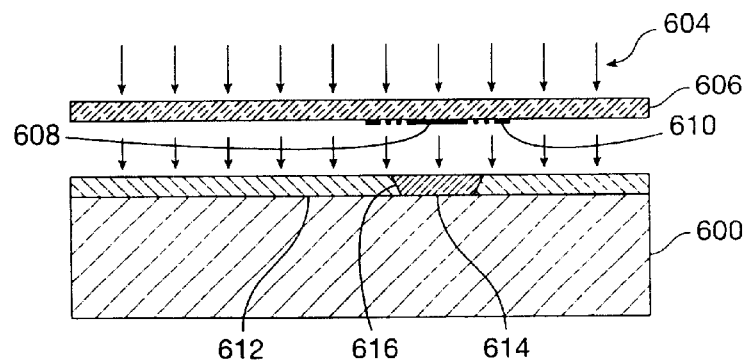

FIG. 6B is a simplified cross section illustrating exposure of the photosensitive layer. Light, represented by arrows 604, is shone through a photomask 606. A pattern 608 on the photomask includes optical proximity features 610.

Figure 6C:
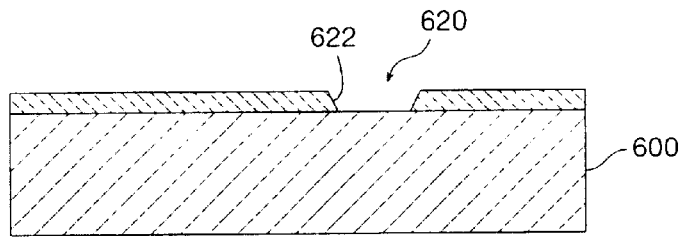

In this case, the central element is a stripe, and the optical proximity features are essentially parallel stripes of a selected width and spacing from the central element. An exposed portion 612 of the photosensitive layer converts, a shadowed portion 614 does not convert, and a transition portion 616, represented by the sloped lines, partially converts to another condition suitable for development. FIG. 6C shows the substrate after the exposed photosensitive layer has been developed. A trench 620 with sloping sidewalls 622 has been formed in the developed photosensitive layer.

Figure 6D:
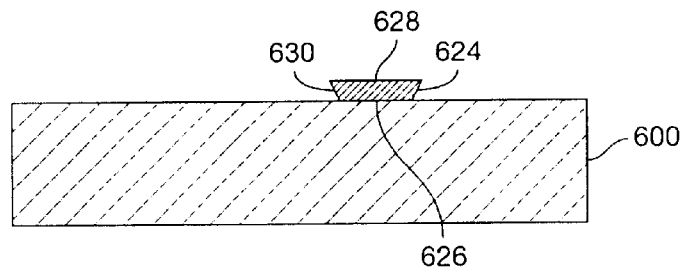

FIG. 6D is a simplified cross section of the substrate with a metal trace 624 after the sacrificial layer has been stripped. The metal trace has been formed by sputtering or pattern plating, for example, which filled in the trench shown in FIG. 6C. A foot 626 of the metal trace is narrower than a top 628 of the trace, and the sidewall slope 630 is preserved according to the trench sidewall 622 of FIG. 6C.

Figure 6E:
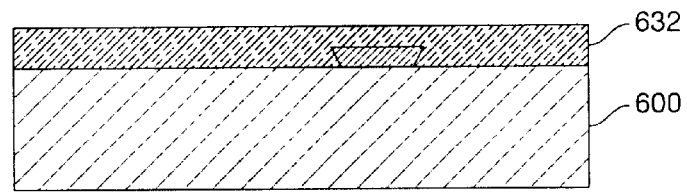

FIG. 6E is a simplified cross section of the metal trace 624 with a dielectric layer 632 formed over the metal trace. The dielectric layer is formed from a liquid material that is polymerized or cured by a thermal process, for example. The liquid precursor can flow under the overhanging sidewalls of the traces, resulting in a dielectric layer that is significantly more resistant to delamination. Other features may have been patterned in the dielectric layer, which is typically photosensitive; however, it is not necessary to expose the portion of the dielectric layer under the overhanging sidewall of the metal trace to polymerize or cure it.

The wider top of the metal trace consumes more area than the narrower foot. Thus, it may be desirable in some applications to adapt the pattern of the traces to reduce the area consumed while retaining the advantages of the sloped sidewall. The metal traces are typically separated from each other a selected distance to achieve a desired electrical isolation.

Figure 7A:
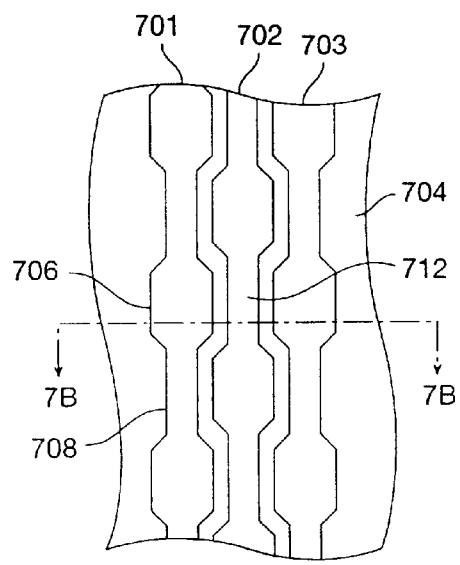
FIGS. 7A and 7B illustrate laying out signal lines according to another embodiment of the present invention.
Figure 7B:
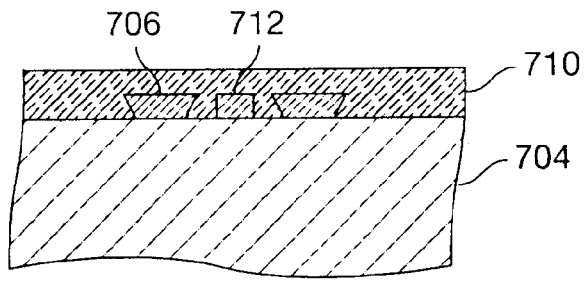

FIG. 7A is a simplified top view of a number of metal traces 701, 702, 703 formed on a substrate 704. The view is looking down through a dielectric layer overlying the traces and substrate, which is represented as clear for purposes of illustration. A first trace 701 has a wide portion 706 and a narrow portion 708. The wide portion corresponds to a section of the trace that has a sloping sidewall, resulting in a wider top. The narrow portion corresponds to a section of the trace that has a vertical sidewall, i.e. a section where optical proximity effects were not used to create a sloping sidewall. An adjacent trace 702 also has narrow and wide sections that alternate with the first trace. Thus, each trace "stitches" the dielectric layer to the substrate to prevent delamination while reducing the line spacing that would be required if each trace were uniformly wide on the top. FIG. 7B is a simplified cross section taking along the section line shown in FIG. 7A. The wide portion 706 of the first trace mechanically anchors the dielectric layer 710 to the substrate, while the narrow portion 712 of the adjacent, trace allows finer line pitch.

Several factors affect which mask features to select to create the desired sidewall profile in the dielectric layer or in the sacrificial layer. The light intensity profile in the photosensitive layer, and hence the sidewall profile, derives from a number of variables, including the width of features on the photomask pattern, the number of features, the spacing between the features, sensitivity (contrast) of the photosensitive layer, thickness of the photosensitive layer, exposure time, and exposure intensity, among other factors. Multiple test patterns can be used to determine the optimum mask pattern to achieve the desired effect in the photosensitive layer. A design-of-experiments ("DOE") method can help identify the most relevant variable(s) and values, and produce a suitable mask with a reduced number of trial conditions. Once a mask pattern and exposure condition has been identified, a trial sample is fabricated to verify that the openings, spacings, sidewall slope, and other parameters meet production requirements before a mask is placed into production. In a preferred embodiment, the dielectric layer is V-259PA™ dielectric material, with a thickness of about 10 microns over the underlying metal layer.

Figure 8:
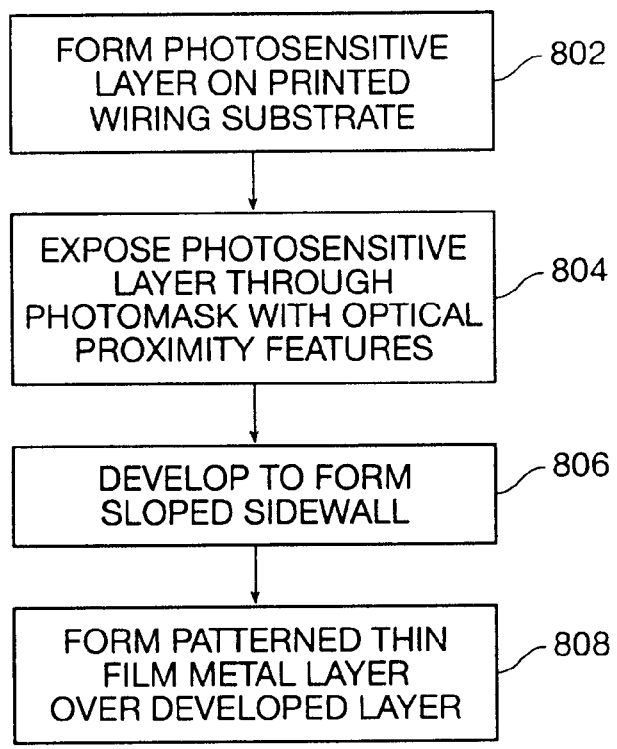
FIG. 8 is a flow chart of a method of the present invention.

FIG. 8 is a simplified flow chart of a method of forming a sloped sidewall in a layer of a thin-film stack according to an embodiment of the present invention. A layer of photosensitive material, such as pre-baked dielectric precursor or photoresist, is formed on a laminated substrate (step 802). The substrate can include a build-up layer(s), a patterned metal layer, and/or thin-film layers. The layer is exposed to light through a photomask that includes optical proximity features to expose selected portions of the layer (step 804). The exposed layer is then developed (step 806) to remove some portions of the layer and to leave other portions of the layer remaining, and to leave a sidewall portion adjacent to a remaining portion wherein the sidewall portion has a slope of a selected angle between about 50–80 degrees from the major surface of the substrate. The sidewall angle is selected according to the optical proximity features on the photomask, in conjunction with the type of resist, including the contrast of the resist, and the exposure, among other parameters. The photosensitive layer is generally exposed and developed according to the manufacturer's instructions to reliably remove the material from the appropriate regions, and leave the material where desired. The optical proximity features allow the use of a high-contrast resist, thus preserving pattern definition and allowing formation of fine-pitch vias. In an optional step, a patterned thin-film metal layer is formed over the layer, including the sloped sidewall (step 808). In a further embodiment, the sidewall portion is a sidewall of a contact via that has an oblong or teardrop shape to a contact pad (e.g., a non-circular contact pad) on the surface of a dielectric layer. The thin-film metal layer forms a reliable electrical connection between the contact pad and a metal feature underlying the via. In a specific embodiment, the pitch between vias (center-to-center) is between about 50–250 microns and the largest diameter of the contact pad is between about 38–160 microns. Of course, advantages of the invention can be realized with larger pads and greater pitch.

While the invention has been described above in terms of specific embodiments, those skilled in the art will recognize other embodiments and equivalents. For example, other materials and dimensions than those described above could be used with success using the method of the present invention, and other structures could be formed. Specifically, other pad shapes could be formed, for example, or other signal line configurations. Therefore, the invention should not be limited to the examples given above, but by the following claims.

What is claimed is:

1. A method for controlling a sidewall profile of an opening in a layer of photosensitive material, the method comprising:

forming a layer of photosensitive material on a substrate;

exposing selected portions of the layer of photosensitive material to light from a light source through a photomask, the photomask having selected optical proximity features, to form an exposed portion, an unexposed portion, and a transition portion of the layer, wherein both a size and a spacing of the selected optical proximity features is equal to or smaller than a resolution limit for an exposure tool employed in the exposing of the selected portions; and developing the layer of photosensitive material to form an opening in the layer, the opening having a sloping sidewall.

2. The method of claim 1 wherein the selected optical proximity features have a maximum dimension less than about 80% of a resolution limit of an exposure tool used in the exposing step.

3. The method of claim 1 wherein the layer of photosensitive material comprises a polymer dielectric material having a thickness between about 4–10 microns.

4. The method of claim 1 wherein the opening is a via opening, and further comprising a step of forming a patterned metal layer, a first portion of the patterned metal layer defining a non-circular contact pad on an upper surface of the layer of photosensitive material and a second portion of the patterned metal layer being disposed on the sidewall of the via opening to electrically couple the non-circular contact pad to a conductive feature underlying the via opening.

5. The method of claim 1 wherein the layer is a sacrificial layer and wherein the opening defines a trench, and further comprising steps of:

forming a patterned metal layer, a portion of the patterned metal layer being disposed in the trench;

stripping the sacrificial layer from the substrate to form a metal trace with an overhanging sidewall from the portion of the patterned metal disposed in the trench;

dispensing a liquid polymer precursor over the patterned metal layer to fill beneath the overhanging sidewall; and curing the liquid polymer precursor to form a dielectric layer over the patterned metal layer.

6. The method of claim 1 wherein the sidewall of the opening forms an angle of between 50–80 degrees to a plane parallel to the substrate.

7. The method of claim 6 wherein the layer of photosensitive material is used as an insulation layer in a high density wiring substrate.

8. The method of claim 1 wherein the sidewall of the opening forms an angle of between 60–75 degrees to a plane parallel to the substrate.

9. The method of claim 8 wherein the layer of photosensitive material is used as an insulation layer in a high density wiring substrate.

10. The method of claim 1 wherein the opening is an oblong shape with a long-axis intersecting first and second opposing sidewalls and wherein at least said first sidewall forms an angle of between 50–80 degrees to a plane parallel to the substrate.

11. The method of claim 10 wherein the second sidewall forms an angle of between 50–80 degrees to a plane parallel to the substrate.

12. The method of claim 11 wherein the oblong opening comprises third and fourth opposing sidewalls between said first and second sidewalls and wherein said third and fourth sidewalls are perpendicular to the plane parallel to the substrate.

13. The method of claim 12 wherein the layer of photosensitive material is used as an insulation layer in a high density wiring substrate.

14. The method of claim 11 wherein the layer of photosensitive material is used as an insulation layer in a high density wiring substrate.

15. The method of claim 10 wherein the layer of photosensitive material is used as an insulation layer in a high density wiring substrate.

16. The method of claim 1 wherein the layer of photosensitive material is used as an insulation layer in a high density wiring substrate.

17. A method of forming a contact via in a thin-film stack of a printed wiring substrate, the method comprising:

forming a layer of photosensitive dielectric material on a substrate;

exposing the layer of photosensitive dielectric material to light from a light source through a photomask, the photomask having a via photo-pattern including optical proximity elements disposed around a first portion of a perimeter of the via photo-pattern and excluding optical proximity elements around a second portion of the perimeter of the via photo-pattern, to form an exposed portion, a non-exposed portion, and a transition portion of the layer of photosensitive dielectric material, wherein both a size and a spacing of the optical proximity elements is equal to or smaller than a resolution limit for an exposure tool employed in the exposing of the layer of photosensitive dielectric material; and developing the layer of photosensitive dielectric material to remove a first portion of the photosensitive dielectric material to thereby form a via opening with a sloped sidewall portion of the via opening corresponding to the first portion of the perimeter of the via photo-pattern.

18. The method of claim 17 further comprising depositing metal over the developed layer of photosensitive dielectric material and in the via opening.

19. The method of claim 18 wherein a plurality of via openings are formed in the layer of photosensitive dielectric material such that a pitch between said plurality of via openings is between 50 and 250 microns.

20. The method of claim 17 wherein the sidewall of the via opening forms an angle of between 50–80 degrees to a plane parallel to the substrate.

21. The method of claim 17 wherein the sidewall of the via opening forms an angle of between 60–75 degrees to a plane parallel to the substrate.

22. The method of claim 17 wherein the via opening is an oblong shape with a long-axis intersecting first and second opposing sidewalls and wherein at least said first sidewall forms an angle of between 50–80 degrees to a plane parallel to the substrate.

23. The method of claim 22 wherein the second sidewall forms an angle of between 50–80 degrees to a plane parallel to the substrate.

24. The method of claim 23 wherein the oblong opening comprises third and fourth opposing sidewalls between said first and second sidewalls and wherein said third and fourth sidewalls are perpendicular to the plane parallel to the substrate.

25. A method for controlling a sidewall profile of an opening in a layer of photosensitive material, the method comprising:

forming a layer of photosensitive material on a substrate, the layer having an upper surface and a lower surface;

exposing selected portions of the layer of photosensitive material to light from a light source through a photomask, the photomask having transparent and opaque portions and having selected optical proximity features, to form an exposed portion, an unexposed portion, and a transition portion of the layer, wherein both a size and a spacing of the selected optical proximity features is equal to or smaller than a resolution limit for an exposure tool employed in the exposing of the selected portions; and developing the layer of photosensitive material to form an opening through the layer, the opening having a sloping sidewall that results in the opening in the upper surface being larger than an opening in the lower surface.

26. The method of claim 25 wherein the opening is a via opening, and further comprising a step of forming a patterned metal layer, a first portion of the patterned metal layer defining a non-circular contact pad on an upper surface of the layer of photosensitive material and a second portion of the patterned metal layer being disposed on the sidewall of the via opening to electrically couple the non-circular contact pad to a conductive feature underlying the via opening.

27. The method of claim 25 wherein the layer is a sacrificial layer and wherein the opening defines a trench, and further comprising steps of:

forming a patterned metal layer, a portion of the patterned metal layer being disposed in the trench;

stripping the sacrificial layer from the substrate to form a metal trace with an overhanging sidewall from the portion of the patterned metal disposed in the trench;

dispensing a liquid polymer precursor over the patterned metal layer to fill beneath the overhanging sidewall; and curing the liquid polymer precursor to form a dielectric layer over the patterned metal layer.

28. A method of forming a contact via in a thin-film stack of a printed wiring substrate, the method comprising:

forming a layer of photosensitive dielectric material on a substrate, the layer having an upper surface and a lower surface;

exposing the layer of photosensitive dielectric material to light from a light source through a photomask, the photomask having transparent and opaque portions and having a via photo-pattern including optical proximity elements disposed around a first portion of a perimeter of the via photo-pattern and excluding optical proximity elements around a second portion of the perimeter of the via photo-pattern, to form an exposed portion, a non-exposed portion, and a transition portion of the layer of photosensitive dielectric material, wherein both a size and a spacing of the optical proximity elements is equal to or smaller than a resolution limit for an exposure tool employed in the exposing of the layer of photosensitive dielectric material; and developing the layer of photosensitive dielectric material to remove a first portion of the photosensitive dielectric material to thereby form a via opening with a sloped sidewall portion that results in the via opening in the upper surface being larger than the via opening in the lower surface.

29. The method of claim 28 wherein the sidewall of the via opening forms an angle of between 50–80 degrees to a plane parallel to the substrate.

30. The method of claim 28 wherein the sidewall of the via opening forms an angle of between 60–75 degrees to a plane parallel to the substrate.

* * * * *